United States Patent [19]
Gardner et al.

[11] Patent Number: 6,159,804
[45] Date of Patent: Dec. 12, 2000

[54] DISPOSABLE SIDEWALL OXIDATION FABRICATION METHOD FOR MAKING A TRANSISTOR HAVING AN ULTRA SHORT CHANNEL LENGTH

[75] Inventors: Mark I. Gardner, Cedar Creek; H. Jim Fulford; Charles E. May, both of Austin, all of Tex.

[73] Assignee: Advanced Micro Devices, Inc., Austin, Tex.

[21] Appl. No.: 09/145,663

[22] Filed: Sep. 2, 1998

[51] Int. Cl.[7] .................................................... H01L 29/72
[52] U.S. Cl. ........................ 438/265; 438/303; 438/585; 438/592; 438/595; 438/647; 438/684; 438/694
[58] Field of Search ................... 438/265, 303, 438/585, 592, 595, 647, 684, 694

[56] References Cited

U.S. PATENT DOCUMENTS 6,037,228  3/2000  Hsu ........................................ 438/279

*Primary Examiner*—Edward Wojciechowicz
*Attorney, Agent, or Firm*—Williams, Morgan & Amerson, P.C.

[57] ABSTRACT

The present invention is directed to a method of making a transistor having a very short channel length. The method generally comprises forming a plurality of process layers above a surface of a semiconducting substrate, one of the process layers being comprised of a gate dielectric material and another of the process layers being comprised of a gate conductor material. The method further comprises patterning the plurality of process layers to define an opening and forming a first sidewall spacer in the opening adjacent at least the process layer comprised of a gate conductor material. The method continues with the formation of a gate conductor mask by oxidation of a portion of at least one of the process layers other than those layers comprised of a gate dielectric material and the gate conductor material. A portion of the process layer comprised of a gate conductor material is then removed to define a gate conductor positioned beneath the gate conductor mask, followed by the formation of a second sidewall spacer adjacent the gate conductor. Thereafter, at least one source/drain region is formed to complete the transistor formation. The present invention further comprises a transistor having a channel length of less than 1000 Å.

34 Claims, 5 Drawing Sheets

DISPOSABLE SIDEWALL OXIDATION FABRICATION METHOD FOR MAKING A TRANSISTOR HAVING AN ULTRA SHORT CHANNEL LENGTH

BACKGROUND OF THE INVENTION

1. Field of the Invention

The present invention is generally directed to the field of semiconductor processing, and, more particularly, to a method of making a transistor with a very short channel length.

2. Description of the Related Art

There is a constant drive within the semiconductor industry to increase the operating speed of integrated circuit devices, e.g, microprocessors, memory devices, etc. This drive is fueled by consumer demands for computers and electronic devices that operate at increasingly greater speeds. The speed at which integrated circuit devices, e.g., transistors, operate may be determined, in part, by the channel length of the transistor device. All other things being equal, the smaller the channel length of the transistor, the faster the transistor will operate. Thus, there is a constant drive to reduce the channel length on transistors to increase the overall speed of the transistor, as well as integrated circuit devices incorporating such transistors.

The ability to reduce the channel length, or feature size, of modem transistors is presently limited by modem photolithography equipment and techniques. Traditionally, components of a transistor, such as the gate conductor and gate dielectric, are made by forming the appropriate process layers, e.g., silicon dioxide and polysilicon, above the surface of a semiconducting substrate, forming a layer of photoresist above the layer of polysilicon, developing and patterning the layer of photoresist to define a mask that covers what will become the gate conductor and gate oxide, and removing the portions of the polysilicon and silicon dioxide layers that extend beyond the mask through one or more etching steps.

Using the traditional photolithography techniques described above, the feature size, e.g., the width of the gate conductor, is a result of directly forming the feature size in a layer of photoresist, or other similar masking layer, above the semiconducting substrate. In order to achieve further reduction in the feature size of transistors, e.g., the channel length, it is necessary to develop an alternative method that will allow formation of transistors with feature sizes smaller than that achievable with current photolithography techniques.

The present invention is directed to a method of making a semiconductor device that minimizes or reduces some or all of the aforementioned problems.

SUMMARY OF THE INVENTION

The present invention is directed to a method of making a transistor having a very short channel length. The method generally comprises forming a plurality of process layers above a surface of a semiconducting substrate, one of the process layers being comprised of a gate dielectric material and another of the process layers being comprised of a gate conductor material. The method further comprises patterning the plurality of process layers to define an opening and forming a first sidewall spacer in the opening adjacent at least the process layer comprised of a gate conductor material. The method continues with the formation of a gate conductor mask by oxidation of a portion of at least one of the process layers other than those layers comprised of a gate dielectric material and the gate conductor material. A portion of the process layer comprised of a gate conductor material is then removed to define a gate conductor positioned beneath the gate conductor mask, followed by the formation of a second sidewall spacer adjacent the gate conductor. Thereafter, at least one source/drain region is formed to complete the transistor formation.

The present invention is further comprised of a transistor having a very short channel length. The transistor is comprised of a gate dielectric positioned above a semiconducting substrate, and a gate conductor positioned above the gate dielectric. The transistor has a channel length of less than 1000 Å, the channel length being defined by the width of the gate dielectric.

BRIEF DESCRIPTION OF THE DRAWINGS

The invention may be understood by reference to the following description taken in conjunction with the accompanying drawings, in which like reference numerals identify like elements, and in which.

Figure 1:
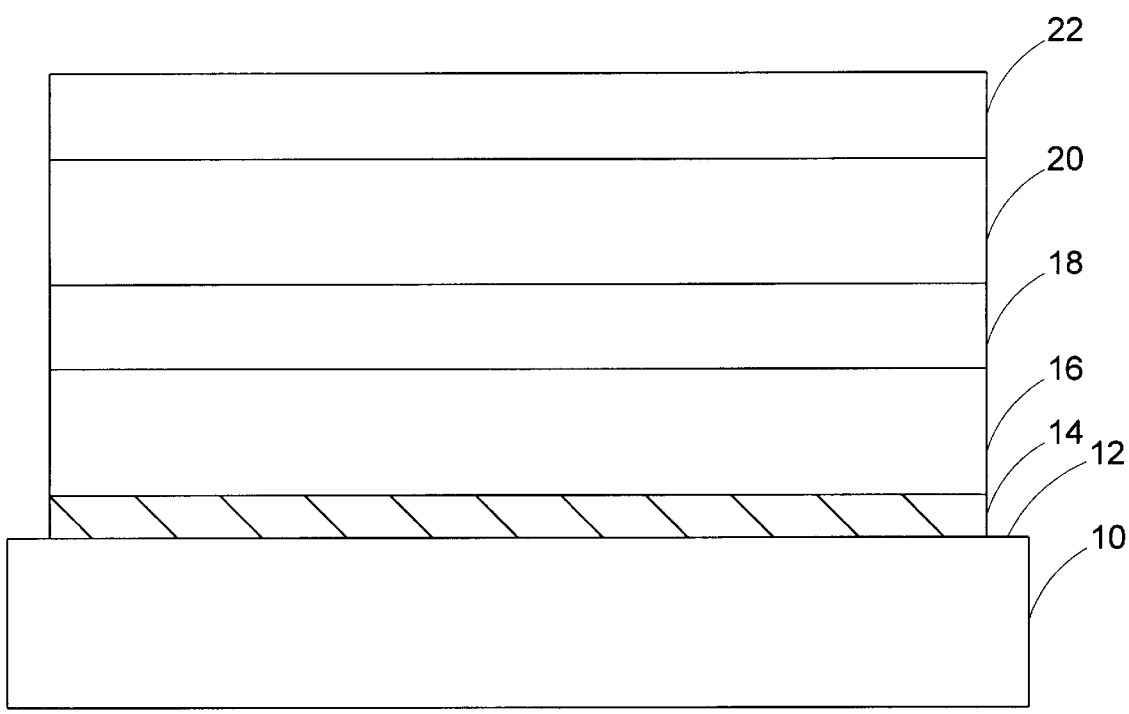
FIG. 1 is a cross-sectional view of an illustrative semiconducting substrate with a plurality of process layers formed above the substrate.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 1–6. Although the various regions and structures of a semiconductor device are depicted in the drawings as having very precise, sharp configurations and profiles, those skilled in the art recognize that, in reality, these regions and structures are not as precise as indicated in the drawings. Nevertheless, the attached drawings are included to provide illustrative examples of the present invention.

As shown in FIG. 1, a plurality of process layers 14, 16, 18, 20 and 22 are formed above the surface 12 of a semiconducting substrate 10. All of these layers 14, 16, 18, 20 and 22 may be formed using traditional techniques commonly employed in the semiconducting industry for formation of such layers, e.g., chemical vapor deposition (CVD), low pressure chemical vapor deposition (LPCVD), sputter deposition, thermal growing, etc. In one illustrative embodiment, the semiconducting substrate is comprised of silicon.

As depicted in FIG. 1, the first process layer 14 is formed above the surface 12 of the substrate 10. The first process layer 14 may be comprised of a variety of materials, such as silicon dioxide, oxynitride, silicon nitride, or any nitrogen bearing oxide. As more fully described below, a portion of the first process layer 14 will ultimately act as the gate dielectric for the transistors made using the present method. In one illustrative embodiment, the first process layer 14 is comprised of a thermally grown layer of silicon dioxide having a thickness ranging from approximately 20–30 Å.

The next process involves formation of the second process layer 16 above the first process layer 14. The second process layer 16 may be comprised of a variety of materials, such as polysilicon or a metal, such as tantalum or titanium. The second process layer 16 may be formed by any of a variety of traditional techniques, such as CVD or sputter deposition. In one illustrative embodiment, the second process layer 16 is comprised of a layer of polysilicon that has a thickness ranging from approximately 700–1500 Å.

The next process involves formation of the third process layer 18 above the second process layer 16. The third process layer 18 may be comprised of a variety of materials, such as silicon nitride, oxynitride, or other like material that is not subject to oxidation. The third process layer 18 may be formed by any of a variety of traditional techniques, such as LPCVD or sputter deposition. In one illustrative embodiment, the third process layer 18 is comprised of a layer of silicon nitride that has a thickness ranging from approximately 50–150 Å.

Next, the fourth process layer 20 is formed above the third process layer 18. The fourth process layer 20 may be comprised of a variety of materials that may be subsequently oxidized, such as polysilicon, tantalum and titanium. The fourth process layer 20 may be formed by any of a variety of traditional techniques, such as CVD, LPCVD or sputter deposition. In one illustrative embodiment, the fourth process layer 20 is comprised of a layer of polysilicon that has a thickness ranging from approximately 200–800 Å.

The next process involves formation of the fifth process layer 22 above the fourth process layer 20. The fifth process layer 22 may be comprised of a variety of materials, such as silicon nitride, oxynitride, or other like material that is resistant to oxidation. The fifth process layer 22 may be formed by any of a variety of traditional techniques, such as CVD or sputter deposition. In one illustrative embodiment, the fifth process layer 22 is comprised of a layer of silicon nitride that has a thickness ranging from approximately 50–500 Å.

Figure 2:
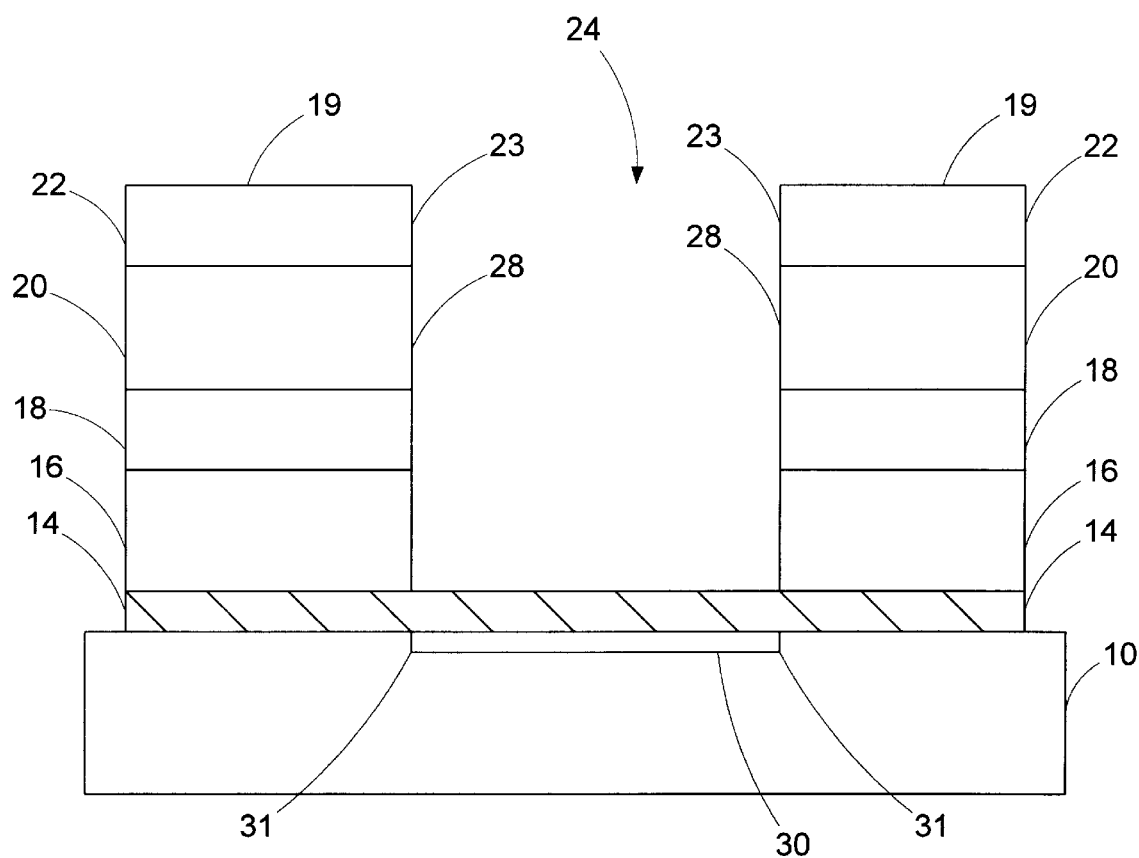
FIG. 2 is a cross-sectional view of the structure shown in FIG. 1 after an opening has been formed in some of the plurality of process layers.

As shown in FIG. 2, the next process involves patterning at least the second process layer 16, third process layer 18, fourth process layer 20, and fifth process layer 22 to define an opening 24. The opening 24 is defined by sidewalls 23. This patterning exposes edges 28 of the fourth process layer 20. This patterning can be accomplished by a variety of known techniques, such as the formation of a layer of photoresist (not shown) above a surface 19 of the fifth process layer 22, development of the layer of photoresist, and one or more etching steps to remove portions of the second process layer 16, third process layer 18, fourth process layer 20, and fifth process layer 22. Of course, depending upon the materials from which the process layers 16, 18, 20 and 22 are made, one or more etching chemistries may have to be used to accomplish the removal of portions of the layers. Additionally, if desired, the portion of the first process layer 14 in the opening 24 may be removed to expose the surface 12 of the substrate 10 within the opening 24.

After the formation of the opening 24 in the various process layers, the substrate 10 is subjected to a dopant implantation process that results in the formation of region 30 in the substrate 10. The edges 31 of the region 30 are approximately aligned with the sidewalls 23 of the opening 24. The type of dopant material, as well as the concentration of the dopant atoms, may vary depending upon the particular application and/or the technology involved, e.g., NMOS, PMOS, CMOS, etc. In one illustrative embodiment for an NMOS transistor, the implantation process is accomplished by an ion implantation process at an energy of 2–20 keV at a concentration of $8 \times 10^{13}$–$3 \times 10^{15}$ ions/cm$^2$ of arsenic.

Figure 3:
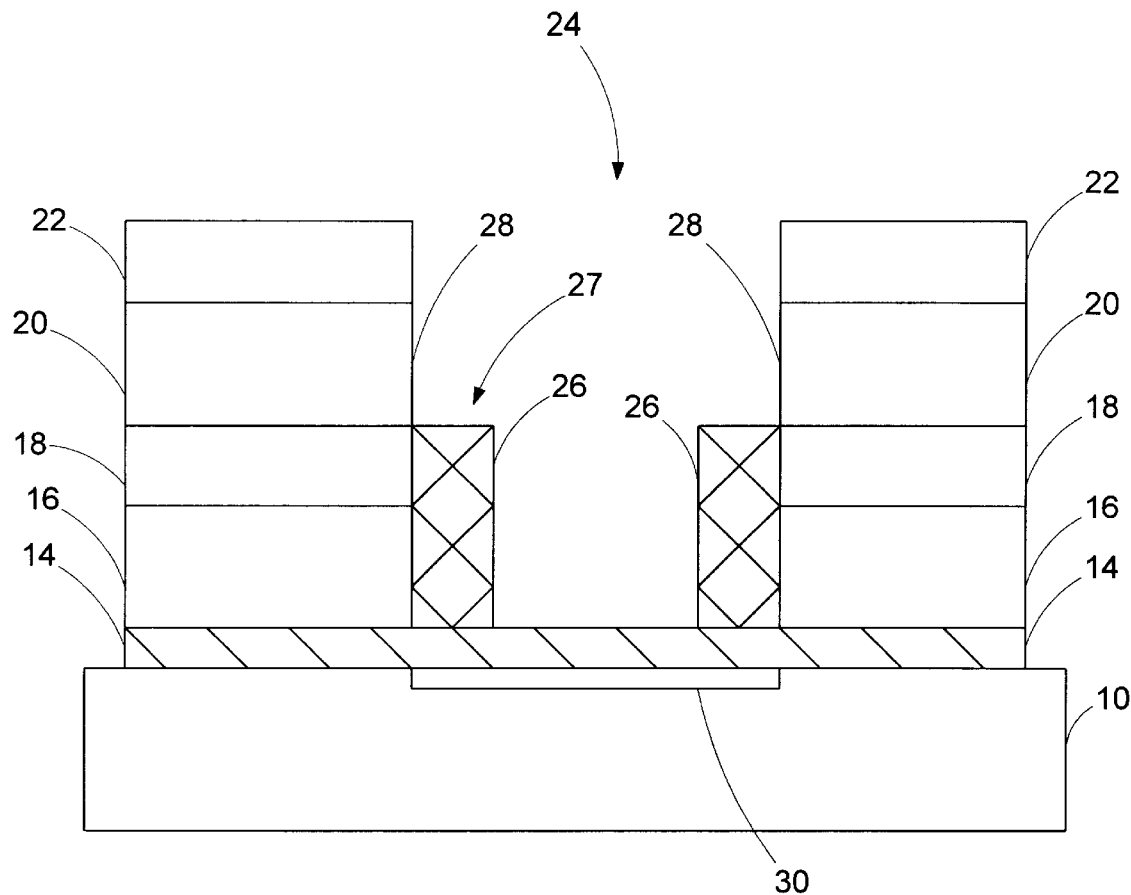
FIG. 3 is a cross-sectional view of the structure shown in FIG. 2 after a plurality of sidewall spacers have been formed in the opening.

Next, as shown in FIG. 3, a plurality of sidewall spacers 26 are formed in the opening 24 adjacent the second process layer 16 and third process layer 18. The sidewall spacers 26 may be comprised of a variety of materials, such as silicon nitride, silicon dioxide, oxynitride, etc. In one illustrative embodiment, the sidewall spacers 26 are comprised of silicon nitride that is formed by a conformal deposition of silicon nitride and a subsequent anisotropic etching of silicon nitride. The resulting sidewall spacers 26 comprised of silicon nitride have a thickness ranging from approximately 50–100 Å. One illustrative etch chemistry that may be used to form the silicon nitride sidewall spacers 26 is comprised of HBr and $Cl_2$, or $NF_3$ and He as the etchant gases. Note that, after the formation of the sidewall spacers 26, the edges 28 of the fourth process layer 20 within the opening 24 are exposed and not covered by the sidewall spacers 26.

Figure 4:
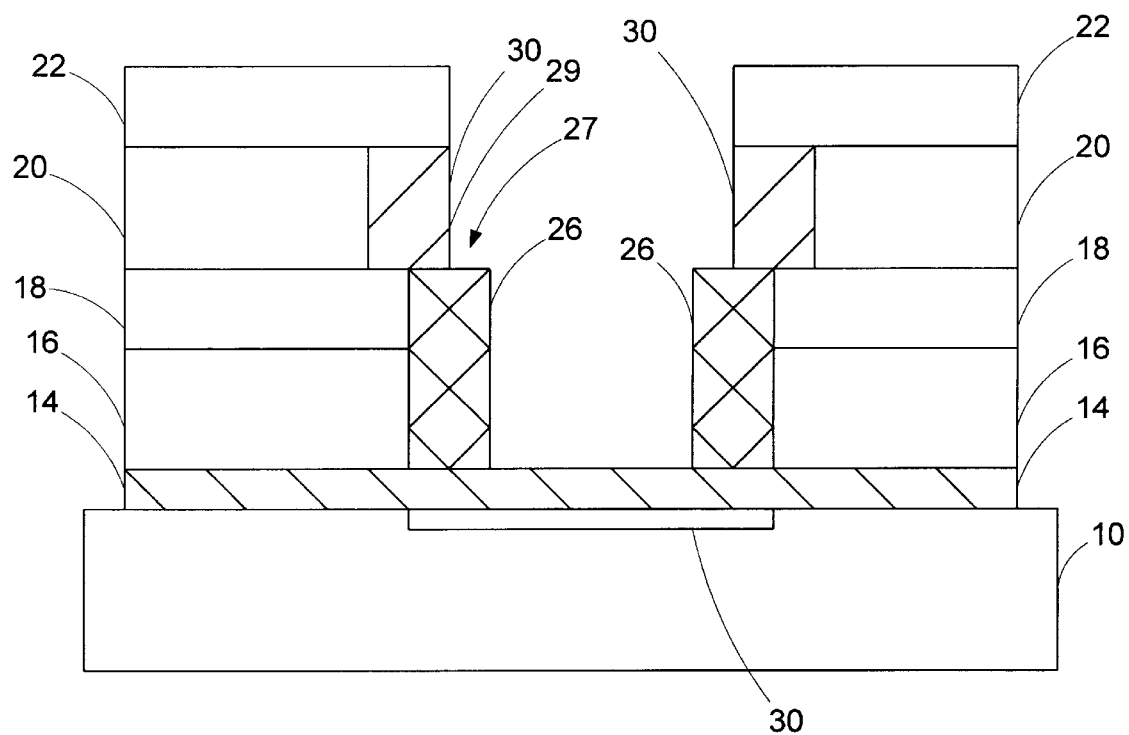
FIG. 4 is a cross-sectional view of the structure shown in FIG. 3 after it has been subjected to an oxidation process.

The edges 28 of the fourth process layer 20 are next subjected to an oxidation process to form the plurality of oxide masks 30 as depicted in FIG. 4. This oxidation process may be carried out at a temperature ranging between 800–1050° C. and may be accomplished by a rapid thermal anneal process (1–5 minutes) or in a tube furnace (10–40 minutes) in the presence of oxygen. In one illustrative embodiment, the oxide masks 30 have a thickness that may be as little as approximately 200 Å. Of course, the thickness of the oxide masks 30 may be varied as a matter of design choice, and may be controlled by varying the time and/or temperature that the fourth process layer 20 is subjected to the oxidation temperatures.

During the oxidation process used to form the oxide masks 30, some of the fourth process layer 20 is consumed. In the illustrative example where the fourth process layer 20 is comprised of polysilicon and the oxide mask 30 is approximately 200 Å thick, approximately 100 Å of the fourth process layer 20 will be consumed in the formation of the oxide mask 30. Thus, in this embodiment, an area 27 of the sidewall spacer 26 lies beyond the edge 29 of the oxide mask 30. Additionally, although not shown in the drawings, the portion of the first process layer 14 positioned between the sidewall spacers 26 within the opening 24 oxidizes at a greater rate due to the fact it has previously been implanted with a dopant material, as described above with respect to FIG. 2.

Figure 5:
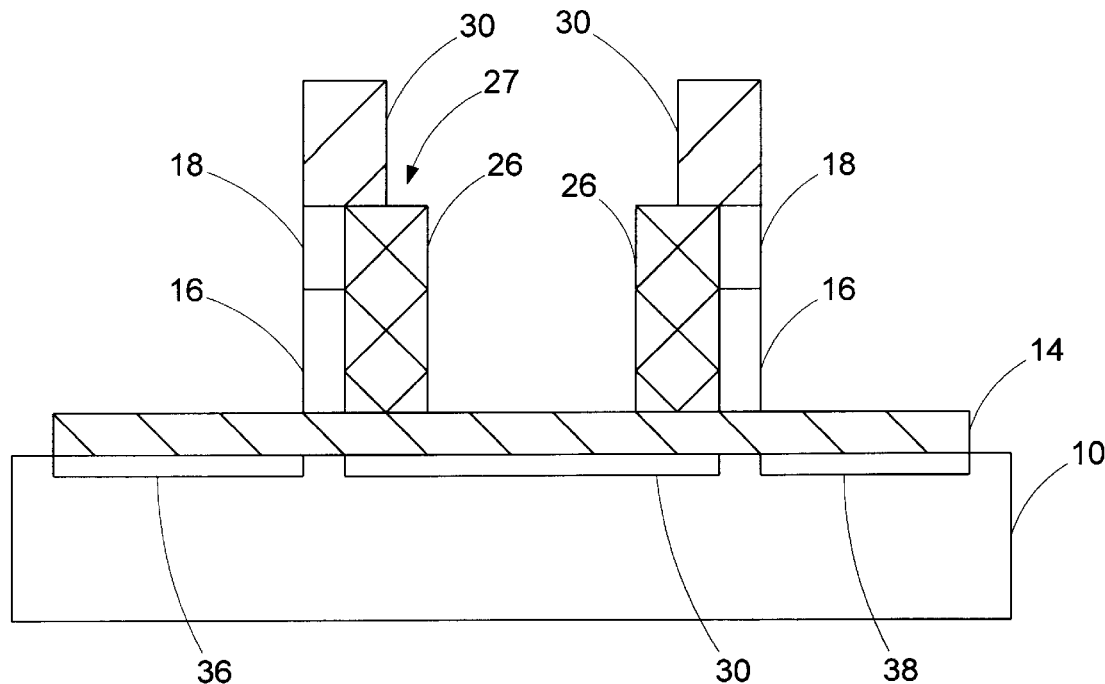
FIG. 5 is a cross-sectional view of the structure shown in FIG. 4 after portions of the various process layers have been removed.

Next, as shown in FIG. 5, portions of the remaining portions of the process layers 22, 20, 18 and 16 may be removed, for example, by one or more etching steps. For example, in the illustrative embodiment, where the second and fourth process layers 16, 20 are comprised of polysilicon, and the third and fifth process layers 18, 22 are comprised of silicon nitride, the various layers may be removed with selective etch chemistries followed by a change in the chemistry to remove subsequent layers. Although not depicted in the drawings, during the removal of the fifth and third process layers 22, 18, comprised of silicon nitride in one illustrative example, a portion of the area 27 of the silicon nitride sidewall spacer 26 that extends beyond the edges 29 of the oxide spacers 30 will also be removed by an amount that corresponds to the combined thickness of the fifth and third process layers 22, 18. For this reason, the height of the sidewall spacer 26 should initially be made greater than the desired finished height of the sidewall spacer 26 on the ultimate transistor.

After portions of the various process layers 22, 20, 18 and 16 are removed as depicted in FIG. 5, the substrate 10 is again subjected to a dopant implantation process which results in the formation of the regions 36, 38, as shown in FIG. 5. During this process, the region 30 is also subjected to this same implant step. In one illustrative embodiment, this implantation process may be carried out by ion implantation at an energy of 2–10 keV at a concentration of $3$–$9 \times 10^{15}$ ions/cm$^2$ of, for example, arsenic.

Figure 6:
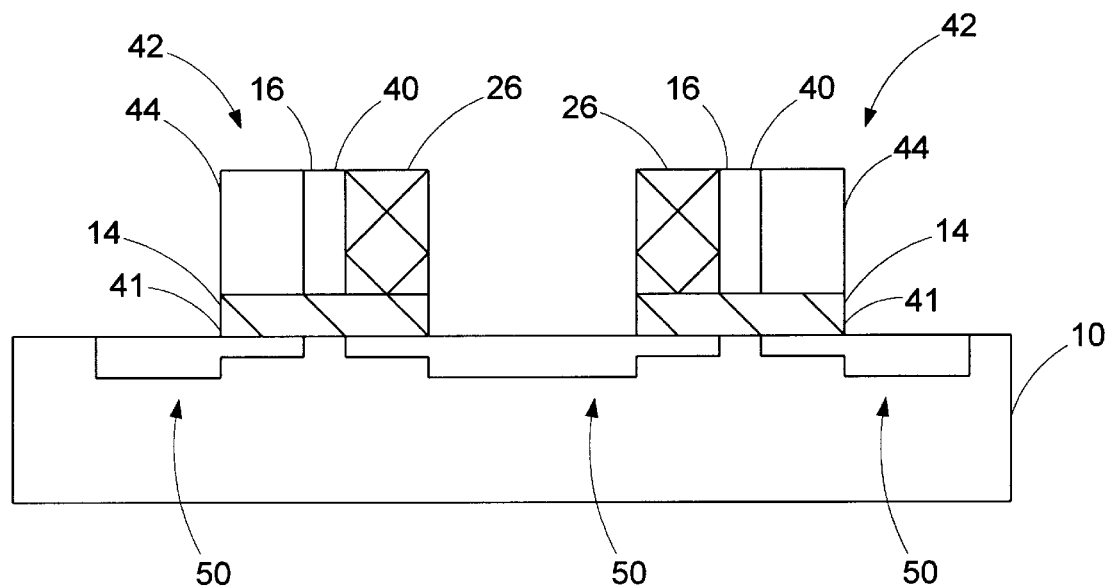
FIG. 6 is a cross-sectional view of the completed transistor formed using the present invention.

Thereafter, as shown in FIG. 6, the oxide mask 30, and the portion of the process layer 18 positioned beneath the oxide mask 30, are removed in one or more etching steps. As is readily apparent to those skilled in the art, the remaining portion of the second process layer 16, as shown in FIG. 5, will be a gate conductor 40 of a transistor device 42. Similarly, the remaining portion of the first process layer 14 will be a gate dielectric 41 of the transistor device 42.

To complete the formation of the transistors 42, a plurality of sidewall spacers 44 are formed adjacent the gate conductors 40. The sidewall spacers 44 may be comprised of a variety of materials, such as silicon dioxide, silicon nitride, oxynitride, etc. The sidewall spacers 44 may be formed by conformal deposition of, for example, silicon dioxide, followed by an anisotropic etch of that material.

The substrate 10 may then be subjected to a second, higher energy dopant implantation step that results in the formation of the final LDD source/drain regions 50, as shown in FIG. 6. In one illustrative embodiment, this final implant is accomplished by ion implantation at an energy level of approximately 10–30 keV at a concentration of $3$–$9 \times 10^{15}$ ions/cm$^2$ of, for example, arsenic for NMOS technology. If desired, the source/drain region 50 positioned between the two transistors 42 may be separated by a previously-formed isolation (not shown), or it may serve as a common source/drain for both of the transistors 42.

Through use of the present method, transistors may be formed having a very short channel length. For example, using the present technique, transistors may be formed with a channel length ranging from approximately 100–1000 Å, the channel length of the transistor being defined by the width of the gate dielectric. In one illustrative embodiment, a transistor with a channel length of approximately 200 Å may be made using the present invention. Thus, the present technique allows for the manufacture of smaller devices that greatly enhance the operating speed and electrical performance of modern semiconductor devices.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of making a transistor, comprising:

forming a plurality of process layers above a surface of a semiconducting substrate, one of said process layers comprised of a gate dielectric material and another of said process layers comprised of a gate conductor material;

patterning said plurality of process layers to define an opening;

forming a first sidewall spacer in said opening adjacent at least said process layer comprised of a gate conductor material;

forming a gate conductor mask by oxidizing a portion of at least one of said plurality of process layers other than said process layers comprised of a gate dielectric material and a gate conductor material;

removing a portion of at least said process layer comprised of a gate conductor material to define a gate conductor positioned beneath said gate conductor mask;

forming a second sidewall spacer adjacent said gate conductor; and forming at least one source/drain region.

2. The method of claim 1, wherein forming a plurality of process layers above a semiconducting substrate, comprises:

forming a first process layer above a surface of a semiconducting substrate, said first process layer comprised of a gate dielectric material; and forming a second process layer above said first process layer, said second process layer comprised of a gate conductor material.

3. The method of claim 1, wherein forming a first sidewall spacer in said opening adjacent at least said process layer comprised of a gate conductor material comprises depositing a conformal layer of a spacer material adjacent at least said second process layer and etching said layer of spacer material.

4. The method of claim 1, wherein forming a gate conductor mask by oxidizing a portion of at least one of said plurality of process layers other than said process layers comprised of a gate dielectric material and a gate conductor material comprises performing a heat treatment at a temperature ranging from approximately 850–1050° C. in the presence of oxygen.

5. The method of claim 1, wherein removing a portion of at least said process layer comprised of a gate conductor material to define a gate conductor positioned beneath said gate conductor mask comprises etching a portion of at least said process layer comprised of a gate conductor material to define a gate conductor positioned beneath said gate conductor mask.

6. The method of claim 1, wherein forming a second sidewall spacer adjacent said gate conductor comprises depositing a conformal layer of a spacer material adjacent at least said gate conductor and etching said layer of spacer material.

7. The method of claim 1, further comprising removing portions of said process layer comprised of a gate dielectric material.

8. The method of claim 1, wherein forming a plurality of process layers above a surface of a semiconducting substrate, one of said layers comprised of a gate dielectric material and another of said layers comprised of a gate conductor material comprises forming a layer of silicon dioxide adjacent said surface of said substrate, said layer of silicon dioxide having a thickness ranging from approximately 20–30 Å.

9. The method of claim 1, wherein forming a plurality of process layers above a surface of a semiconducting substrate, one of said layers comprised of a gate dielectric material and another of said layers comprised of a gate conductor material comprises forming a layer comprised of silicon dioxide, oxynitride or silicon nitride adjacent said surface of said substrate, said layer having a thickness ranging from approximately 20–30 Å.

10. The method of claim 8, wherein forming a layer of silicon dioxide adjacent said surface of said substrate, said layer of silicon dioxide having a thickness ranging from approximately 20–30 Å comprises thermally growing a layer of silicon dioxide adjacent said surface of said substrate, said layer of silicon dioxide having a thickness ranging from approximately 20–30 Å.

11. The method of claim 1, wherein forming a plurality of process layers above a surface of a semiconducting substrate, one of said layers comprised of a gate dielectric material and another of said layers comprised of a gate conductor material comprises depositing a layer of polysilicon above said process layer comprised of a gate dielectric material, said layer of polysilicon having a thickness ranging from approximately 700–1500 Å.

12. A method of making a transistor, comprising:

forming a first process layer above a surface of a semiconducting substrate, said first process layer comprised of a gate dielectric material;

forming a second process layer above said first process layer, said second process layer comprised of a gate conductor material;

forming a plurality of process layers above said second process layer, at least one of said layers being comprised of a material that may be oxidized;

patterning said plurality of process layers to define an opening;

forming a first sidewall spacer in said opening adjacent at least said second process layer comprised of a gate conductor material;

forming a gate conductor mask by oxidizing a portion of one of said at least one of said layers comprised of a material that may be oxidized;

etching a portion of at least said second process layer comprised of a gate conductor material to define a gate conductor positioned beneath said gate conductor mask;

forming a second sidewall spacer adjacent said gate conductor; and forming at least one source/drain region.

13. The method of claim 12, wherein forming a first sidewall spacer in said opening adjacent at least said second process layer comprised of a gate conductor material comprises depositing a conformal layer of silicon nitride adjacent at least said second process layer and etching said layer of silicon nitride.

14. The method of claim 12, wherein forming a gate conductor mask by oxidizing a portion of one of said at least one of said layers comprised of a material that may be oxidized comprises performing a heat treatment at a temperature ranging from approximately 850–1050° C. in the presence of oxygen.

15. The method of claim 12, wherein forming a second sidewall spacer adjacent said gate conductor comprises depositing a conformal layer of silicon dioxide adjacent at least said gate conductor and etching said layer of silicon dioxide.

16. The method of claim 12, further comprising removing portions of said first process layer comprised of a gate dielectric material.

17. The method of claim 12, wherein forming a first process layer above a surface of a semiconducting substrate, said first layer comprised of a gate dielectric material, comprises forming a layer of silicon dioxide adjacent said surface of said substrate, said layer of silicon dioxide having a thickness ranging from approximately 20–30 Å.

18. The method of claim 17, wherein forming a layer of silicon dioxide adjacent said surface of said substrate, said layer of silicon dioxide having a thickness ranging from approximately 20–30 Å comprises thermally growing a layer of silicon dioxide adjacent said surface of said substrate, said layer of silicon dioxide having a thickness ranging from approximately 20–30 Å.

19. The method of claim 12, wherein forming a second process layer above said first process layer, said second process layer comprised of a gate conductor material, comprises depositing a layer of polysilicon above said first process layer, said layer of polysilicon having a thickness ranging from approximately 700–1500 Å.

20. A method of making a transistor, comprising:

forming a first process layer of silicon nitride adjacent a surface of a semiconducting substrate;

forming a second process layer of polysilicon above said first process layer;

forming a plurality of layers above said second process layer, at least one of said plurality of layers comprising a third process layer, said third process layer being comprised of polysilicon;

patterning said first process layer, said second process layer and said plurality of layers to define an opening;

forming a sidewall spacer comprised of silicon nitride in said opening adjacent at least said second process layer;

forming a sidewall spacer comprised of silicon nitride in said opening adjacent at least said second process layer;

forming a gate conductor mask by oxidizing a portion of said third process layer;

removing a portion of at least said second process layer to define a gate conductor positioned beneath said gate conductor mask;

forming a second sidewall spacer adjacent said gate conductor; and forming at least one source/drain region.

21. The method of claim 20, wherein forming said first process layer of silicon nitride adjacent a surface of a semiconducting substrate comprises thermally growing said first process layer of silicon nitride adjacent a surface of a semiconducting substrate.

22. The method of claim 20, wherein forming said second process layer of polysilicon above said first process layer comprises depositing said second process layer of polysilicon above said first process layer.

23. The method of claim 20, wherein forming said third process layer above said second process layer comprises depositing said third process layer above said second process layer.

24. A method of making a transistor, comprising:

forming a first process layer comprised of a gate dielectric material above a surface of a substrate;

forming a second process layer comprised of a gate conductor material above said first process layer;

forming a third process layer above said second process layer, said third process layer comprised of a material that may be oxidized;

patterning said third process layer to expose an edge portion of said third process layer;

oxidizing said edge portion of said third process layer to define a mask that will be used to pattern said first and second process layers;

patterning said first and second process layers to define a gate dielectric and a gate conductor for said transistor; and forming at least one source/drain region.

25. The method of claim 24, wherein forming a first process layer comprised of a gate dielectric material above a surface of a substrate comprises forming a first process layer comprised of silicon dioxide, oxynitride or silicon nitride above a surface of a substrate.

26. The method of claim 24, wherein forming a first process layer comprised of a gate dielectric material above a surface of a substrate comprises forming a first process layer comprised of silicon dioxide above a surface of a substrate, said layer of silicon dioxide having a thickness ranging from approximately 20–30 Å.

27. The method of claim 24, wherein forming a second process layer comprised of a gate conductor material above said first process layer comprises forming a second process layer comprised of polysilicon, tantalum or titanium above said first process layer.

28. The method of claim 24, wherein forming a second process layer comprised of a gate conductor material above said first process layer comprises forming a second process layer comprised of polysilicon or a metal above said first process layer.

29. The method of claim 24, wherein forming a second process layer comprised of a gate conductor material above said first process layer comprises forming a second process layer comprised of polysilicon above said first process layer, said layer of polysilicon having a thickness ranging from approximately 700–1500 Å.

30. The method of claim 24, wherein forming a third process layer above said second process layer comprises forming a third process layer above said second process layer, said third process layer comprised of polysilicon, tantalum or titanium.

31. The method of claim 24, wherein forming a third process layer above said second process layer comprises forming a third process layer above said second process layer, said third process layer comprised of polysilicon or a metal.

32. The method of claim 24, wherein oxidizing said edge portion of said third process layer to define a mask that will be used to pattern said first and second process layers comprises performing a heat treatment at a temperature ranging from approximately 850–1050° C. in the presence of oxygen.

33. The method of claim 24 wherein patterning said first and second process layers to define a gate dielectric and a gate conductor for said transistor comprises performing a plurality of etching processes.

34. A method of making a transistor, comprising:

forming a first process layer comprised of silicon dioxide above a surface of a substrate;

forming a second process layer comprised of polysilicon above said first process layer;

forming a third process layer above said second process layer, said third process layer comprised of polysilicon or a metal;

etching said third process layer to expose an edge portion of said third process layer;

oxidizing said edge portion of said third process layer to define a mask that will be used to pattern said first and second process layers;

etching said first and second process layers to define a gate dielectric and a gate conductor for said transistor; and forming at least one source/drain region.

* * * * *